(12) United States Patent
Yang et al.

(10) Patent No.: US 10,991,997 B2
(45) Date of Patent: Apr. 27, 2021

(54) ENERGY STORAGE CONTAINER AND HEAT DISSIPATION SYSTEM FOR THE SAME

(71) Applicant: SUNGROW POWER SUPPLY CO., LTD., Anhui (CN)

(72) Inventors: Youjin Yang, Anhui (CN); Guohong Li, Anhui (CN); Zengfu Ding, Anhui (CN)

(73) Assignee: SUNGROW POWER SUPPLY CO., LTD., Anhui (CN)

(*) Notice: Subject to any disclaimer, the term of this patent is extended or adjusted under 35 U.S.C. 154(b) by 96 days.

(21) Appl. No.: 16/414,385

(22) Filed: May 16, 2019

(65) Prior Publication Data

US 2020/0083574 A1 Mar. 12, 2020

(30) Foreign Application Priority Data

Sep. 12, 2018 (CN) .......................... 201821501229.3

(51) Int. Cl.
*H01M 10/613* (2014.01)
*H02K 9/06* (2006.01)
*H05K 7/20* (2006.01)

(52) U.S. Cl.
CPC ............ *H01M 10/613* (2015.04); *H02K 9/06* (2013.01); *H05K 7/20145* (2013.01)

(58) Field of Classification Search
None
See application file for complete search history.

(56) References Cited

FOREIGN PATENT DOCUMENTS

CN          206976530 U          2/2018

*Primary Examiner* — Daniel S Gatewood
(74) *Attorney, Agent, or Firm* — Harness, Dickey & Pierce, P.L.C.

(57) ABSTRACT

An energy storage container and a heat dissipation system for the same are provided. The heat dissipation system for the energy storage container includes a container body, and a battery module assembly and multiple air conditioning modules both located in the container body. In a length direction or a width direction of the container body, each of two side ends of the battery module assembly is provided with at least one air conditioning module. The heat dissipation system further includes an air supply duct and an air return duct, a partition plate is arranged in the air supply duct, to divide the air supply duct into a first air supply duct and a second air supply duct which are mutually independent. The above arrangement avoids increasing a height of the energy storage container, thereby effectively facilitating the transportation and installation of the energy storage container.

14 Claims, 2 Drawing Sheets

ENERGY STORAGE CONTAINER AND HEAT DISSIPATION SYSTEM FOR THE SAME

CROSS-REFERENCE TO RELATED APPLICATIONS

This application claims the benefit of priority to Chinese Patent Application No. 201821501229.3 titled "ENERGY STORAGE CONTAINER AND HEAT DISSIPATION SYSTEM FOR THE SAME", filed with the Chinese State Intellectual Property Office on Sep. 12, 2018, the entire disclosure of which is incorporated herein by reference.

FIELD

The present application relates to the technical field of power energy storage, and more particularly to an energy storage container and a heat dissipation system for the energy storage container.

BACKGROUND

With the development of new energy technologies, the power energy storage technology is developed rapidly, and energy storage containers are gradually being widely used.

An energy storage container includes a container body and a battery module assembly located in the container body. The operation of the battery module assembly needs to be within a certain temperature range, and the entire battery system requires extremely high uniformity of the ambient temperature. At present, a top-mounted air conditioner is mounted at the top of the container, and an air supply port and an air return port of the air conditioner are both on the bottom surface of the air conditioner. That is, the top of the container is provided with an air inlet in communication with the air supply port and an air outlet in communication with the air return port. The cold air is sent to the back of the battery rack through the air supply port and the air inlet, and pumped to the front of the battery by a fan on the battery module assembly to be discharged, and then returned to the air return port through the air outlet, the heat generated by the battery is taken away at the same time, and thus the heat dissipation and cooling are realized.

With the above heat dissipation structure, the temperature of the battery module assembly in a small-sized energy storage container can be controlled. However, there are the following disadvantages due to the limitation of the heat dissipation structure:

1. since the top-mounted air conditioner is required to be mounted at the top of the container, the container with the top-mounted air conditioner is relatively higher. Due to restrictions of sea transportation, it is impossible to ship the entire container having the top-mounted air conditioner, and the top-mounted air conditioner must be transported separately and installed on site. Since the air conditioner is heavy, and the weight is generally greater than 70 kg, the installation on site is troublesome, resulting in the inconvenience in transportation and installation of the entire structure;

2. in order to facilitate transportation and installation, the weight of the top-mounted air conditioner is required to be reduced, resulting in a smaller cooling capacity and a poor heat dissipation effect of the top-mounted air conditioner, which can only meet the heat dissipation requirements of the small-sized energy storage container; and 3. due to the small cooling capacity of a single top-mounted air conditioner, multiple air conditioners are required to be connected in parallel, resulting in more complicated control and more faulty nodes.

SUMMARY

In view of this, an object of the present application is to provide a heat dissipation system for an energy storage container, to facilitate transportation and installation. Another object of the present application is to provide an energy storage container having the above heat dissipation system.

In order to achieve the above objects, the following technical solutions are provided according to the present application.

A heat dissipation system for an energy storage container includes a container body, and a battery module assembly and a plurality of air conditioning modules both located in the container body. The air conditioning module is configured to send out cooling air to cool the battery module assembly. In a length direction or a width direction of the container body, each of two side ends of the battery module assembly is provided with at least one air conditioning module;

the heat dissipation system further includes an air supply duct in communication with air supply ports of the air conditioning modules, and an air return duct in communication with air return ports of the air conditioning modules; the battery module assembly is located between the air supply duct and the air return duct, and the air supply duct and the air return duct are in communication with each other through a heat dissipation passage in the battery module assembly; and a partition plate is arranged in the air supply duct, and the partition plate is configured to divide the air supply duct into a first air supply duct and a second air supply duct, the first air supply duct and the second air supply duct are independent with respect to each other; the first air supply duct is in communication with an air supply port of an air conditioning module located at one side end of the battery module assembly, and the second air supply duct is in communication with an air supply port of an air conditioning module located at the other side end of the battery module assembly.

Preferably, the air supply duct or the air return duct is located at a top of the battery module assembly.

Preferably, the air supply duct is located at the top of the battery module assembly; the air supply duct is provided with at least two air supply outlets, and the air supply outlets are distributed in a length direction of the air supply duct.

Preferably, a plurality of battery module assemblies are provided, and the battery module assemblies are distributed at two sides of the air supply duct.

Preferably, two air conditioning modules are provided, the first air supply duct and the second air supply duct are in one-to-one correspondence with the two air conditioning modules respectively; the air return duct includes a first air return duct and a second air return duct, the first air return duct and the second air return duct are also in one-to-one correspondence with the two air conditioning modules respectively; both the first air return duct and the second air return duct are in communication with the first air supply duct, and the first air return duct and the second air return duct are in communication with the second air supply duct.

Preferably, each of the air conditioning modules includes at least one air conditioner.

Preferably, the air conditioner of the air conditioning module is an integrated air conditioner.

Based on the above heat dissipation system for the energy storage container, an energy storage container is further provided according to the present application. The energy storage container includes a heat dissipation system, and the heat dissipation system is the heat dissipation system for the energy storage container according to any one of the above solutions.

In the heat dissipation system for the energy storage container according to the present application, the air conditioning module is arranged at the side end of the battery module assembly in the length direction or the width direction of the container body, which avoids increasing a height of the energy storage container, and shipping of the entire energy storage container having the air conditioning module can be realized, so that it is not necessary to separately transport the air conditioning module and install the air conditioning module on site, thereby effectively facilitating the transportation and installation of the energy storage container.

In addition, with the heat dissipation system for the energy storage container according to the present application, the shipping of the entire energy storage container having the air conditioning module can be realized, and it is not necessary to reduce the weight of the air conditioning module due to separate transportation of the air conditioning module. Compared with the conventional art, an air conditioning module having a larger weight, that is the air conditioning module having a larger cooling capacity may be used, which effectively improves a heat dissipation effect, and thus the heat dissipation requirements of a large-scale energy storage container can be satisfied. Moreover, since the air conditioning module having a larger cooling capacity may be used, the number of the air conditioners may be reduced, thereby simplifying control and reducing faulty nodes.

BRIEF DESCRIPTION OF THE DRAWINGS

For more clearly illustrating the technical solutions in embodiments of the present application or the conventional art, drawings referred to describe the embodiments or the conventional art will be briefly described hereinafter. Apparently, the drawings in the following description are embodiments of the present application, and for the person skilled in the art, other drawings may be obtained based on these drawings without any creative efforts.

DETAILED DESCRIPTION

The technical solutions according to embodiments of the present application are described clearly and completely hereinafter in conjunction with the drawings in the embodiments of the present application. Apparently, the described embodiments are only a part of the embodiments of the present application, rather than all of the embodiments. All the other embodiments obtained by those skilled in the art based on the embodiments in the present application without any creative work belong to the scope of protection of the present application.

Figure 1:
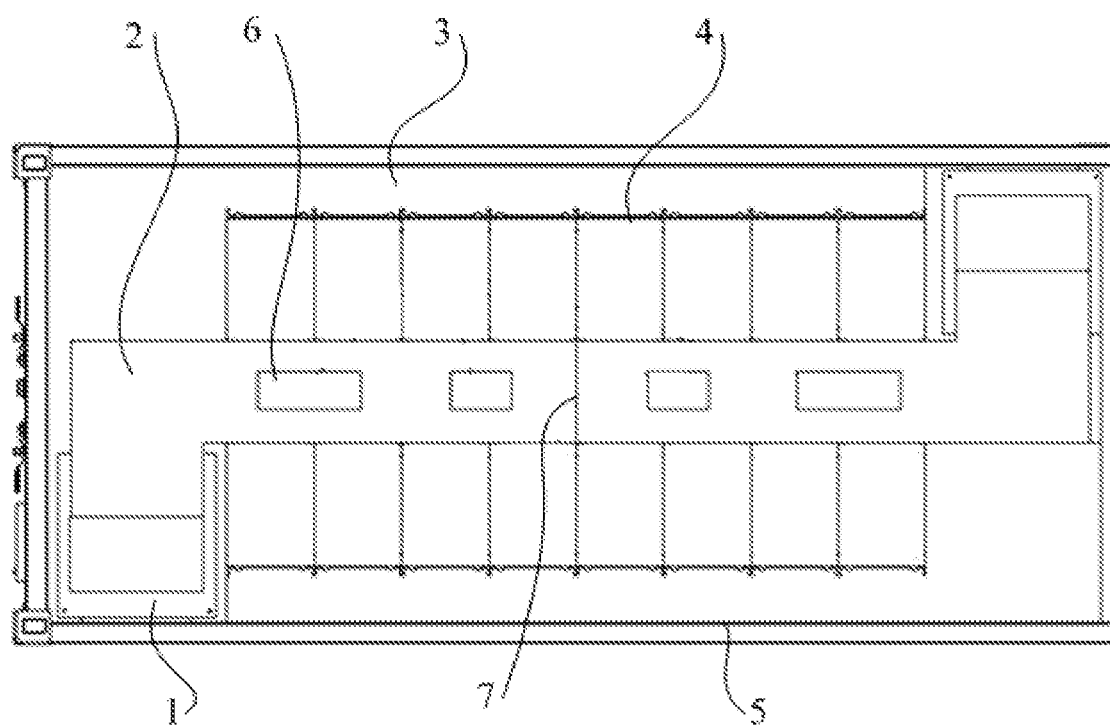
FIG. 1 is a schematic view showing the structure of a heat dissipation system for an energy storage container according to an embodiment of the present application.
Figure 2:
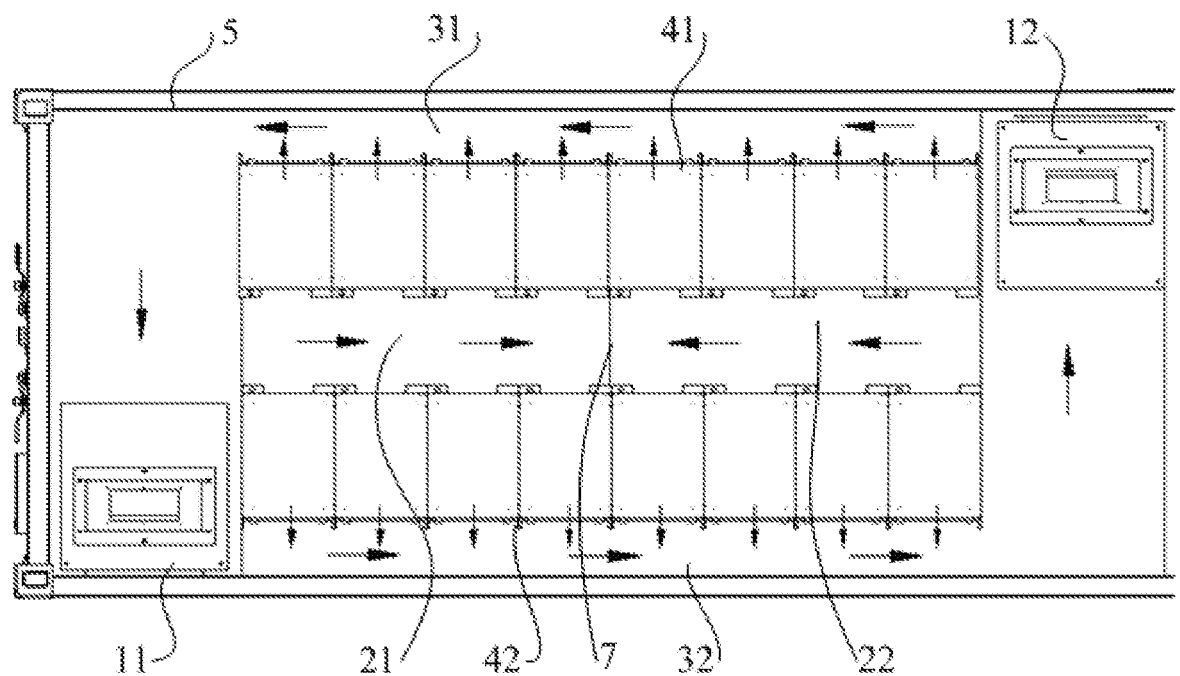
FIG. 2 is a schematic view showing air circulation flow in the heat dissipation system for the energy storage container according to the embodiment of the present application.

As shown in FIGS. 1 and 2, a heat dissipation system for an energy storage container according to an embodiment of the present application includes a container body 5, and a battery module assembly 4 and an air conditioning module 1 both located in the container body 5. The air conditioning module 1 is configured to send out cooling air to cool the battery module assembly 4. In a length direction or a width direction of the container body 5, the air conditioning module 1 is located at a side end of the battery module assembly 4. It can be understood that, the above battery module assembly 4 includes a plurality of energy storage batteries.

In order to facilitate heat dissipation, the air conditioning module 1 is located at the side end of the battery module assembly 4 preferably in the length direction of the container body 5.

In the heat dissipation system for the energy storage container according to the embodiment of the present application, the air conditioning module 1 is arranged at the side end of the battery module assembly 4 in the length direction or the width direction of the container body 5, which avoids increasing a height of the energy storage container, and shipping of the entire energy storage container having the air conditioning module can be realized, so that it is not necessary to separately transport the air conditioning module and install the air conditioning module on site, thereby effectively facilitating the transportation and installation of the energy storage container.

In addition, with the heat dissipation system for the energy storage container according to the embodiment of the present application, the shipping of the entire energy storage container having the air conditioning module 1 can be realized, and it is not necessary to reduce the weight of the air conditioning module 1 due to separate transportation of the air conditioning module 1. Compared with the conventional art, an air conditioning module having a larger weight, that is the air conditioning module having a larger cooling capacity may be used, which effectively improves a heat dissipation effect, and thus the heat dissipation requirements of a large-scale energy storage container can be satisfied. Moreover, since the air conditioning module having a larger cooling capacity may be used, the number of the air conditioners may be reduced, thereby simplifying control and reducing faulty nodes.

In order to improve heat dissipation efficiency, cooling air is allowed to flow along determined air ducts. Specifically, the heat dissipation system for the energy storage container further includes air ducts. The air duct includes an air supply duct 2 in communication with an air supply port of the air conditioning module 1, and an air return duct 3 in communication with an air return port of the air conditioning module 1. The battery module assembly 4 is located between the air supply duct 2 and the air return duct 3, and the air supply duct 2 and the air return duct 3 are in communication with each other through a heat dissipation passage in the battery module assembly 4.

In the above structure, the cooling air enters the air supply duct 2 after being sent out from the air supply port of the air conditioning module 1, and enters the heat dissipation passage of the battery module assembly 4 from the air supply duct 2, then enters the air return duct 3 from the heat dissipation passage, and then returns to the air conditioning module 1 through the air return port. The cooling air is allowed to flow along the determined air ducts, which realizes circulation of the cooling air, and thereby improving the heat dissipation efficiency and the heat dissipation effect.

Preferably, the battery module assembly 4 is equipped with a cooling fan, and the cooling fan draws air from a front of the battery module assembly 4, so as to enhance the heat dissipation effect. Of course, the above battery module assembly 4 may also not be provided with the cooling fan, which is not limited thereto.

In order to facilitate air supply or air return, the air supply duct 2 or the air return duct 3 is located at a top of the battery module assembly 4. Specifically, in a case that the air supply duct 2 is located at the top of the battery module assembly 4, the air supply duct 2 may be provided in a form of a suspended ceiling in the container body 5; and in a case that the air return duct 3 is located at the top of the battery module assembly 4, the air return duct 3 may be provided in a form of a suspended ceiling in the container body 5.

Specifically, in a case that the air supply duct 2 is located at the top of the battery module assembly 4, in order to accelerate the air supply and improve the heat dissipation efficiency, the air supply duct 2 is provided with at least two air supply outlets 6, and the air supply outlets 6 are distributed in a length direction of the air supply duct 2. Correspondingly, in a case that the air return duct 3 is located at the top of the battery module assembly 4, in order to accelerate the air return and improve the heat dissipation efficiency, the air return duct 3 is provided with at least two air return inlets 3, and the air return inlets 3 are distributed in a length of the air return duct 3.

There may also be one air supply outlet and one air return inlet, and the number of the air supply outlet and the number of the air return inlet are chosen according to actual needs, for example, the numbers may be chosen according to the number of the battery module assembly 4 and the number of the energy storage batteries in the battery module assembly 4, which are not limited in the embodiments of this application.

In order to improve the heat dissipation effect, the battery module assembly 4 is arranged at two sides of the air supply duct 2. It can be understood that, in this case, the air return duct 3 is also arranged at the two sides of the air supply duct 2, to ensure that the battery module assembly 4 is located between the air supply duct 2 and the air return duct 3.

An embodiment in which two battery module assemblies 4 are provided is taken as an example herein. Subject to installation requirements in certain countries and regions, battery module assemblies 4 can only be arranged back to back in the container body 5 rather than face to face. The battery module assemblies 4 are installed and maintained outside the container. Specifically, the two battery module assemblies 4 include a first battery module assembly 41 and a second battery module assembly 42. The first battery module assembly 41 and the second battery module assembly 42 are arranged back to back, that is, a back of the first battery module assembly 41 faces a back of the second battery module assembly 42. It can be understood that, a direction in which the cooling air flows through the first battery module assembly 41 is opposite to a direction in which the cooling air flows through the second battery module assembly 42.

Of course, the battery module assembly 4 may also be one or three or more, which is not limited thereto. The number of the energy storage batteries of each battery module assembly 4 is selected according to actual needs, for example, according to a heat generation condition of the energy storage batteries, which is not limited to the embodiment of the present application.

In order to improve the heat dissipation effect, in one embodiment, each of two side ends of the battery module assembly 4 is provided with at least one air conditioning module 1. As an example, there are two air conditioning modules 1 located at the two side ends of the battery module assembly 4, respectively. Specifically, in a case that the air conditioning modules 1 are located at side ends of the battery module assembly 4 in the length direction of the container body 5, that is, the two air conditioning modules 1 are located at two side ends of the battery module assembly 4 in the length direction of the container body 5, respectively; in a case that the air conditioning modules 1 are located at side ends of the battery module assembly 4 in the width direction of the container body 5, that is, the two air conditioning modules 1 are located at two side ends of the battery module assembly 4 in the width direction of the container body 5.

In the above structure, two air return ducts 3 are provided, and the two air return ducts 3 are in one-to-one correspondence with the two air conditioning modules 1, respectively. Specifically, the two air conditioning modules 1 are a first air conditioning module 11 and a second air conditioning module 12 respectively, and the two air return ducts 3 are a first air return duct 31 and a second air return duct 32 respectively. The first air return duct 31 is in communication with an air return port of the first air conditioning module 11, and the second air return duct 32 is in communication with an air return port of the second air conditioning module 12.

Further, in order to facilitate the air supply, two air supply ducts 2 are provided, and the two air supply ducts 2 are in one-to-one correspondence with the two air conditioning modules 1. The two air supply ducts 2 are a first air supply duct 21 and a second air supply duct 22 respectively, the first air supply duct 21 is in communication with an air supply port of the first air conditioning module 11, and the second air supply duct 22 is in communication with an air supply port of the second air conditioning module 12.

Both the two air return ducts 3 are in correspondence with the first air supply duct 21, and both the two air return ducts 3 are in correspondence with the second air supply duct 22. Specifically, both the first air return duct 31 and the second air return duct 32 are in correspondence with the first air supply duct 21, that is, both the first air return duct 31 and the second air return duct 32 are in communication with the first air supply duct 21 through corresponding heat dissipation passages of the battery module assemblies 4, and both the first air return duct 31 and the second air return duct 32 are in correspondence with the second air supply duct 22, that is, both the first air return duct 31 and the second air return duct 32 are in communication with the second air supply duct 22 through corresponding heat dissipation passages of the battery module assemblies 4.

In the above structure, the two battery module assemblies 4 are a first battery module assembly 41 and a second battery module assembly 42, respectively. A part of the first battery module assembly 41 is located between the first air supply duct 21 and the first air return duct 31, and another part of the first battery module assembly 41 is located between the second air supply duct 22 and the first air return duct 31. A part of the second battery module assembly 42 is located between the first air supply duct 21 and the second air return duct 32, and another part of the second battery module assembly 42 is located between the second air supply duct 22 and the second air return duct 32.

For convenience of description, the first air supply duct 21, the second air supply duct 22, the first air return duct 31, the second air return duct 32, the air supply duct 2, and the air return duct 3 are simply referred to as air ducts. In the heat dissipation system for the energy storage container, the air ducts are independent of one another, thereby ensuring that the cooling air enters the air supply duct 2 after being sent out from the air supply port of the air conditioning module 1, and enters the heat dissipation passage of the battery module assembly 4 from the air supply duct 2, then enters the air return duct 3, and then returns to the air conditioning module 1 through the air return port.

Specifically, the above heat dissipation system for the energy storage container further includes a partition plate 7 arranged in the air supply duct 2, such that the first air supply duct 21 and the second air supply duct 22 are isolated from each other by the partition plate 7, thus realizing mutual independence. In this way, it is convenient to realize mutual independence between the first air supply duct 21 and the second air supply duct 22, thus the cooling air can better flow in the air ducts, and thereby the heat dissipation effect is improved. Of course, the container body 5 may also be designed to realize mutual independence between the first air supply duct 21 and the second air supply duct 22, which is not limited to the above embodiment.

Correspondingly, for other air ducts, mutual independence may be achieved by providing partition plates, or by separately arranging corresponding pipes, which is not limited to the embodiments of the present application.

In the above heat dissipation system for the energy storage container, structure sizes of each of the air ducts are not fixed, and the structure sizes may be determined according to factors such as an actual layout and an air flow rate.

The above air conditioning module 1 includes at least one air conditioner. The specific number of the air conditioner is designed according to the number of the battery module assembly 4 and the heat dissipation requirements, which is not limited to the embodiments of the present application.

The air conditioning module 1 may be three or more, and is not limited to two or one, which is designed according to actual needs.

In order to simplify the structure and reduce space occupation, the above air conditioner of the air conditioning module 1 is embodied as an integrated air conditioner. Of course, the air conditioner may also be a split air conditioner, which is not limited thereto.

The above heat dissipation system for the energy storage container may solve the contradiction between the battery heat dissipation and safety specification in a case that the battery module assembly 4 having the cooling fan is installed in the container body 5. The heat dissipation system has good adaptability, the layout and the dissipation system may be modularized according to actual needs such as a battery capacity and the like.

Based on the heat dissipation system for the energy storage container according to the above embodiments, an energy storage container is provided according to an embodiment of the present application, the energy storage container includes a heat dissipation system, which is the heat dissipation system for the energy storage container according to the above embodiment.

Since the heat dissipation system for the energy storage container has the above technical effects, and the energy storage container includes the heat dissipation system for the energy storage container, the energy storage container also has corresponding technical effects, which will not be described herein.

Based on the above description of the disclosed embodiments, those skilled in the art are capable of carrying out or using the present application. It is obvious for those skilled in the art to make many modifications to these embodiments. The general principle defined herein may be applied to other embodiments without departing from the spirit or scope of the present application. Therefore, the present application is not limited to the embodiments illustrated herein, but should be defined by the broadest scope consistent with the principle and novel features disclosed herein.

The invention claimed is:

1. A heat dissipation system for an energy storage container, comprising: a container body, a battery module assembly and a plurality of air conditioning modules both located in the container body; wherein
    the air conditioning modules are configured to send out cooling air to cool the battery module assembly; in a length direction or a width direction of the container body, each of two side ends of the battery module assembly is provided with at least one air conditioning module;
    the heat dissipation system further comprises an air supply duct in air communication with air supply ports of the air conditioning modules, and an air return duct in air communication with air return ports of the air conditioning modules; the battery module assembly is located between the air supply duct and the air return duct, and the air supply duct and the air return duct are in air communication with each other through a heat dissipation passage in the battery module assembly; and
    a partition plate is arranged in the air supply duct, and the partition plate is configured to divide the air supply duct into a first air supply duct and a second air supply duct, the first air supply duct and the second air supply duct are independent with respect to each other; the first air supply duct is in air communication with an air supply port of an air conditioning module located at one side end of the battery module assembly, and the second air supply duct is in air communication with an air supply port of an air conditioning module located at the other side end of the battery module assembly.

2. The heat dissipation system according to claim 1, wherein the air supply duct or the air return duct is located at a top of the battery module assembly.

3. The heat dissipation system according to claim 1, wherein the air supply duct is located at a top of the battery module assembly, the air supply duct is provided with at least two air supply outlets, and the air supply outlets are distributed in a length direction of the air supply duct.

4. The heat dissipation system according to claim 1, wherein a plurality of battery module assemblies are provided, and the battery module assemblies are distributed at two sides of the air supply duct.

5. The heat dissipation system according to claim 4, wherein two air conditioning modules are provided, the first air supply duct and the second air supply duct are in one-to-one correspondence with the two air conditioning modules respectively; the air return duct comprises a first air return duct and a second air return duct, the first air return duct and the second air return duct are also in one-to-one correspondence with the two air conditioning modules respectively; both the first air return duct and the second air return duct are in air communication with the first air supply duct, and the first air return duct and the second air return duct are in air communication with the second air supply duct.

6. The heat dissipation system according to claim 1, wherein each of the air conditioning modules comprises at least one air conditioner.

7. The heat dissipation system according to claim 6, wherein the air conditioner of the air conditioning module is an integrated air conditioner.

8. An energy storage container, comprising the heat dissipation system according to claim 1.

9. An energy storage container, comprising the heat dissipation system according to claim 2.

10. An energy storage container, comprising the heat dissipation system according to claim 3.

11. An energy storage container, comprising the heat dissipation system according to claim 4.

12. An energy storage container, comprising the heat dissipation system according to claim 5.

13. An energy storage container, comprising the heat dissipation system according to claim 6.

14. An energy storage container, comprising the heat dissipation system according to claim 7.

* * * * *